United States Patent

[11] 3,577,042

[72] Inventor Thomas J. Roach
Palos Verdes Estates, Calif.

[21] Appl. No. 647,038
[22] Filed June 19, 1967
[45] Patented May 4, 1971
[73] Assignee International Rectifier Corporation
El Segundo, Calif.

[54] GATE CONNECTION FOR CONTROLLED RECTIFIERS
6 Claims, 1 Drawing Fig.

[52] U.S. Cl. .......... 317/235, 317/234
[51] Int. Cl. .......... H01l 1/14, H01l 11/10
[50] Field of Search .......... 317/234—235, 41.1, 5, 6, 235/41.4, 234/5.4

[56] References Cited

UNITED STATES PATENTS

| | | | |
|---|---|---|---|
| 2,758,263 | 8/1956 | Robillard | 317/235 |
| 2,858,489 | 10/1958 | Henkels | 317/235 |
| 3,210,563 | 10/1965 | New | 307/88.5 |
| 3,274,667 | 9/1966 | Siebertz | 29/155.5 |
| 3,310,716 | 3/1967 | Emeis | 317/234 |
| 3,400,448 | 9/1968 | Helda et al. | 29/471.1 |
| 3,356,862 | 12/1967 | Diebold et al. | 307/88.5 |
| 3,358,196 | 12/1967 | Steinmetz et al. | 317/234 |
| 2,924,760 | 2/1960 | Herlet | 317/234 |
| 3,160,800 | 12/1964 | Smart | 317/234 |
| 3,381,186 | 4/1968 | Arends | 317/235 |
| 3,489,962 | 1/1970 | McIntyre et al. | 317/235 |

FOREIGN PATENTS

| | | | |
|---|---|---|---|
| 1,064,522 | 4/1967 | Great Britain | 317/234 |
| 1,234,326 | 2/1967 | Germany | 317/234 |
| 6,413,471 | 9/1965 | Netherlands | 317/234 |

*Primary Examiner*—Jerry D. Craig
*Attorney*—Ostrolenk, Faber, Gerb & Soffen

ABSTRACT: A gate lead wire is connected to the third layer of a four-layer semiconductor wafer at a plurality of spaced regions. The wire is received in a slot in the upper expansion plate and extends from the center of the wafer and outwardly.

INVENTOR.
THOMAS J. ROACH

BY

OSTROLENK, FABER, GERB & SOFFEN
ATTORNEYS

GATE CONNECTION FOR CONTROLLED RECTIFIERS

This invention relates to semiconductor devices having a control electrode, and more particularly relates to a novel connection of a lead wire to the third layer of a controlled rectifier.

It is well known that the sensitivity and turn-on time of a controlled rectifier is dependent, in part, on the location and geometry of the gate electrode. Thus, some devices provide an interdigitated arrangement of gate and cathode electrodes, as shown in U.S. Pat. No. 2,858,489 in the name of Henkels. Other devices provide a plurality of separate gate regions, or separate gate segments, as shown in copending application Ser. No. 415,292 filed Dec. 2, 1964, entitled "High Speed Controlled Rectifier", and assigned to the assignee of the present invention, now U.S. Pat. No. 3,356,862.

In accordance with the present invention, the desired plurality of separate gate regions are obtained in a novel and inexpensive manner by bonding a single gate lead wire to the third layer by a plurality of spaced discrete bonds which could be formed by ultrasonic bonding techniques. The novel invention further lends itself to "center gate" arrangements in which the gate connection is at least partly surrounded by the cathode connection, again with the flexible gate lead wire connected to the third layer at a plurality of spaced regions.

It is, therefore, a primary object of this invention to provide an inexpensive controlled rectifier having decreased firing sensitivity and turn-on time.

Another object of this invention is to provide a controlled rectifier having a flexible gate lead which is bonded to the third layer at a plurality of separate regions.

These and other objects of this invention will become apparent from the following description when taken in connection with the drawings in which.

Figures 1, 2, 3, 4, 5, 6:
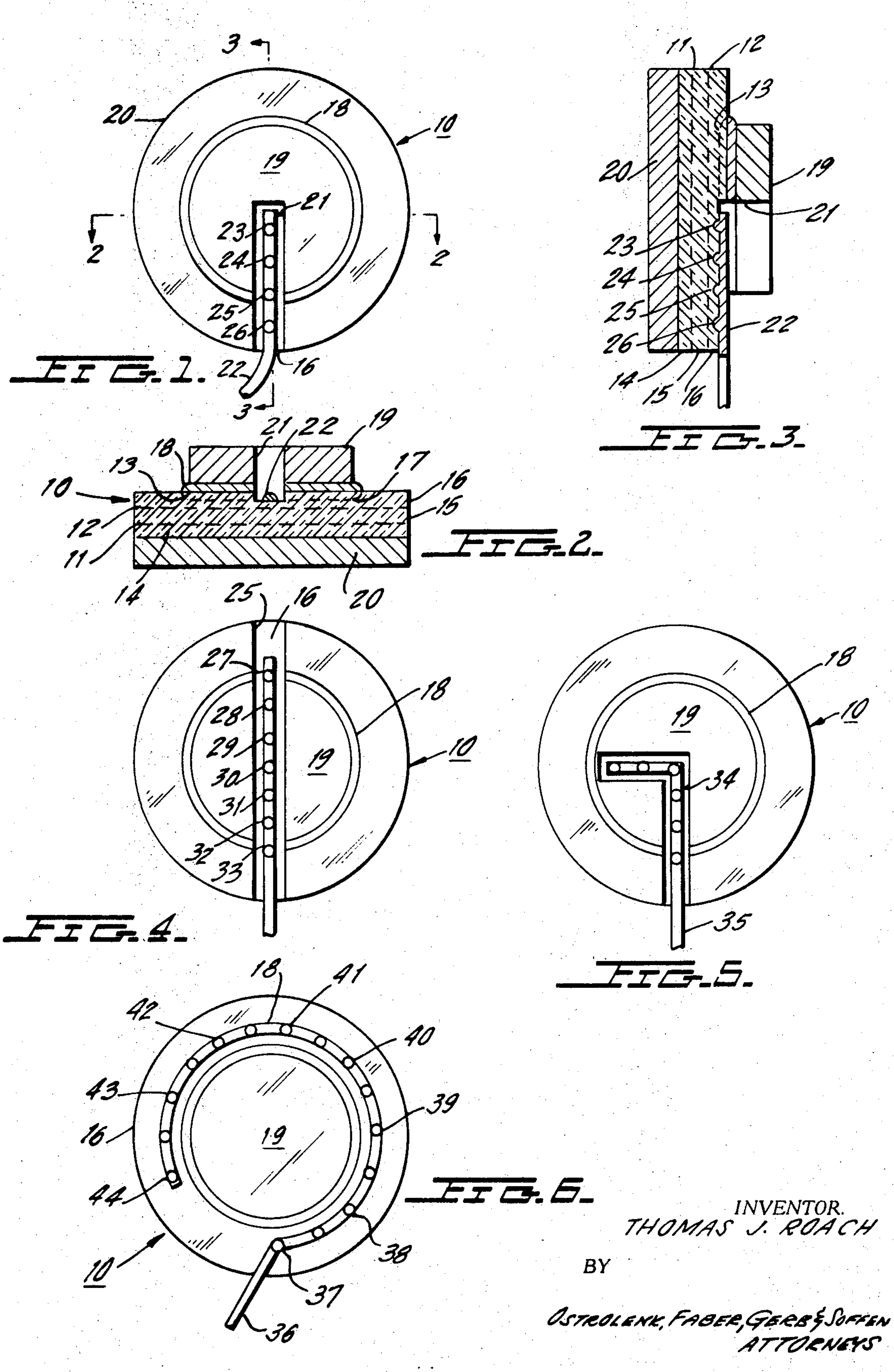
FIG. 1 is a top view of a device made in accordance with the invention.
FIG. 2 is a cross section of FIG. 1 taken across the section line 2–2 in FIG. 1.
FIG. 3 is a cross section of FIG. 1 taken across the section line 3–3 in FIG. 1.
FIG. 4 is a top view, similar to FIG. 1, of a second embodiment of the invention with the gate lead wire extending across the entire top surface of the device.
FIG. 5 is a top view of a further modification of the invention.
FIG. 6 is a top view of a device made in accordance with the invention in which the gate lead wire surrounds the center cathode electrode.

Referring first to FIGS. 1, 2 and 3, there is shown a silicon wafter 10 having three P N junctions 11, 12 and 13 therein, defined between conductivity-type layers 14, 15 and 16 and 17 which are respectively P, N, P and N. Wafer 10 may be formed in any desired manner as by initially forming a P N P structure by diffusion, and forming the upper N region by alloying. For example, disc 18 which may contain any desired N-type impurity, is alloyed on the top of wafter 10 to form upper N region 17 and junction 13. Typically, wafer 10 may have a diameter of one-half to 1½ inches, a thickness of 0.008 to 0.022 inches, and disc 18 may be composed of Au Sb which is alloyed to wafter 10 at a temperature of 800° C. for 30 minutes.

Expansion plates 19 and 20 are then secured to the top and bottom of the wafer, and are of molybdenum or tungsten, or the like. Plates 19 and 20 may be secured by alloying at the same time the junction 13 is formed.

All of the above is standard for the manufacture of controlled rectifiers. In the past, the device was completed by securing a lead wire to the top of layer 16, either outside of disc 18, or through an opening in disc 18. In accordance with the invention, a slot 21 is formed through disc 19, alloy disc 18, and into a portion of the wafer 10, cutting through junction 17 and exposing layer 16. Slot 21 may have a width of 0.040 inch, and extend into the top of wafer 10 for a depth of about 0.0002 inch.

Slot 21 is formed in disc 19 as by a saw cut before disc 19 is secured to the assembly. The wafer 10 and disc 18 have slot 21 formed therein as by etching after alloying of junction 13.

Alternatively, alloy disc 18 may also have a saw cut therein defining a portion of slot 21 whereby, during the alloying operation forming junction 13 and securing disc 18 and 20, the upper surface of the wafer 10 within slot 21 retains the P-type conductivity of layer 16.

Whatever method is used, the top of wafer 10 forming the bottom of slot 21 is the third layer 16. A lead wire 22 is then secured to the top of layer 16 within slot 21, where lead wire 22 is of aluminum, having a diameter of 0.012 inch. Lead wire 22 is then connected to region 16 at plurality of spaced regions 23 to 26 as by ultrasonic bonding familiar to those skilled in the art. Thus, gate lead wire 22 is connected at a plurality of regions between the center and edge of junction 12 to enable control of both sensitivity and turn-on time for complete firing of the device. Obviously, a plurality of such gate and cathode regions could be used on a common wafer with each set formed as shown.

FIG. 4 shows a modification of the invention in which the slot 21 of FIG. 1 is formed as a full slot 25 extending completely through plate 19, with gate lead wire 22 connected to region 16 exposed by slot 25 at points 27 to 33.

FIG. 5 shows a further modification of the invention which shows the slot 34 having an L-shape, with lead wire 35 appropriately bent to conform to the shape of slot 34.

FIG. 6 shows a further modification of the invention in which the gate lead wire 36 surrounds, or partially surrounds, top contact 19 and is bonded to region 16, as by ultrasonic bonding to regions 37 to 44. Obviously, a plurality of cathodes could be surrounded by corresponding gate leads in this manner.

I claim:

1. A semiconductor device comprising a wafer having at least first, second, third and fourth layers of alternately opposite conductivity types, an upper contact plate secured to the top surface of said wafer and said further layer, a lower contact plate secured to the bottom surface of said wafer and said first layer, and a control electrode lead wire; said control electrode lead wire comprising a continuous elongated wire; a continuous surface portion of said third layer reaching said top surface of said wafer; said continuous control electrode lead wire having a first integral portion thereof bonded to said continuous surface portion of said third layer at a plurality of spaced regions; said continuous control electrode lead wire having a second integral portion thereof extending freely from said wafer; all regions of said first integral portion between its said bonded regions being disposed along the top and in contact with said continuous surface portion.

2. The device as set forth in claim 1 wherein said plurality of spaced regions extend from the center of said wafer toward the outer periphery of said wafer.

3. The drive as set forth in claim 1 wherein said upper contact plate has a slot extending through the full thickness thereof; said slot being aligned with said portion of said third layer; said lead wire spaced from the walls of said slot.

4. The device as set forth in claim 1 wherein said first portion of said continuous electrode lead wire extends in a straight line across the full width of said top surface of said wafer.

5. The device as set forth in claim 1 wherein said first portion of said continuous control electrode lead wire extends over said top surface of said wafer in an L-shaped path.

6. The device of claim 1 wherein said first portion of said continuous control electrode lead wire extends arcuately around at least a portion of said top surface of said wafer.